(12) United States Patent
Ma et al.

(10) Patent No.: US 12,287,553 B2
(45) Date of Patent: Apr. 29, 2025

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Wenpeng Ma, Beijing (CN); Yinlong Zhang, Beijing (CN); Zhihua Sun, Beijing (CN); Shulin Yao, Beijing (CN); Pengfei Hu, Beijing (CN); Qi Li, Beijing (CN); Xibin Shao, Beijing (CN); Yanping Liao, Beijing (CN)

(73) Assignees: BEIJING BOE DISPLAY TECHNOLOGY CO., LTD., Beijing (CN); BOE TECHNOLOGY GROUP CO., LTD., Chaoyang (CN)

( * ) Notice: Subject to any disclaimer, the term of this patent is extended or adjusted under 35 U.S.C. 154(b) by 394 days.

(21) Appl. No.: 17/758,334

(22) PCT Filed: Sep. 10, 2021

(86) PCT No.: PCT/CN2021/117701
§ 371 (c)(1),
(2) Date: Jul. 1, 2022

(87) PCT Pub. No.: WO2022/083347
PCT Pub. Date: Apr. 28, 2022

(65) Prior Publication Data
US 2023/0037762 A1    Feb. 9, 2023

(30) Foreign Application Priority Data

Oct. 23, 2020  (CN) .......................... 202011147010.X

(51) Int. Cl.
*G02F 1/1362*    (2006.01)
*G02F 1/133*     (2006.01)
(Continued)

(52) U.S. Cl.
CPC .... *G02F 1/136286* (2013.01); *G02F 1/13306* (2013.01); *G02F 1/13452* (2013.01);
(Continued)

(58) Field of Classification Search
None
See application file for complete search history.

(56) References Cited

U.S. PATENT DOCUMENTS 5,012,228 A    4/1991 Masuda et al.
5,436,635 A    7/1995 Takahara et al.
(Continued)

FOREIGN PATENT DOCUMENTS

CN    1918620 A    2/2007
CN    1991546 A    7/2007
(Continued)

OTHER PUBLICATIONS

ISA China National Intellectual Property Administration, International Search Report and Written Opinion Issued in Application No. PCT/CN2021/117701, Dec. 17, 2021, WIPO, 16 pages. (Submitted with Partial Translation).

(Continued)

*Primary Examiner* — Dung T Nguyen
(74) *Attorney, Agent, or Firm* — McCoy Russell LLP

(57) ABSTRACT

The present disclosure provides an array substrate and a display device. The array substrate includes one start data line, N-1 intermediate data line and one end data line. The array substrate further includes a first driving circuit and a second driving circuit, the first driving circuit is arranged at a first side of the plurality of data lines, and the second driving circuit is arranged at a second side of the plurality of data lines opposite to the first side in a first direction. The first driving circuit is electrically connected to the first end of each of the plurality of data lines. The first driving circuit (Continued)

is electrically coupled to first ends of the plurality of data lines, a first end of the end data line is electrically coupled to a first end of the start data line, and the second driving circuit is electrically coupled to second ends of the plurality of data lines.

14 Claims, 4 Drawing Sheets

(51) Int. Cl.
  *G02F 1/1345* (2006.01)
  *G09G 3/20* (2006.01)
  *H10D 86/40* (2025.01)
  *H10D 86/60* (2025.01)

(52) U.S. Cl.
  CPC ... *G09G 3/2096* (2013.01); *G09G 2300/0413* (2013.01); *G09G 2310/0297* (2013.01); *G09G 2320/043* (2013.01); *H10D 86/443* (2025.01); *H10D 86/60* (2025.01)

(56) References Cited

U.S. PATENT DOCUMENTS

| | | | |
|---|---|---|---|
| 6,246,385 B1 * | 6/2001 | Kinoshita | G09G 3/3685 345/204 |
| 6,310,592 B1 | 10/2001 | Moon et al. | |
| 2002/0060655 A1 | 5/2002 | Moon | |
| 2002/0060661 A1 | 5/2002 | Nah et al. | |
| 2002/0075248 A1 | 6/2002 | Morita et al. | |
| 2005/0184940 A1 | 8/2005 | Oh et al. | |
| 2007/0146518 A1 | 6/2007 | Hong et al. | |
| 2009/0278779 A1 | 11/2009 | Liu et al. | |
| 2015/0316825 A1 | 11/2015 | Lim et al. | |
| 2016/0253955 A1 | 9/2016 | Wu et al. | |
| 2017/0372672 A1 | 12/2017 | Shiomi | |
| 2018/0166004 A1 | 6/2018 | Li et al. | |
| 2018/0233077 A1 | 8/2018 | Fletcher et al. | |
| 2019/0189059 A1 | 6/2019 | Na et al. | |

FOREIGN PATENT DOCUMENTS

| | | |
|---|---|---|
| CN | 101799604 A | 8/2010 |
| CN | 102591084 A | 7/2012 |
| CN | 103592800 A | 2/2014 |
| CN | 104103240 A | 10/2014 |
| CN | 105022198 A | 11/2015 |
| CN | 105047167 A | 11/2015 |
| CN | 105353545 A | 2/2016 |
| CN | 105446034 A | 3/2016 |
| CN | 106097960 A | 11/2016 |
| CN | 106782341 A | 5/2017 |
| CN | 110136658 A | 8/2019 |
| CN | 110337687 A | 10/2019 |
| CN | 210142246 U | 3/2020 |
| CN | 111402826 A | 7/2020 |
| CN | 113421513 A | 9/2021 |
| JP | 2009115936 A | 5/2009 |
| JP | 2009271303 A | 11/2009 |
| KR | 20130097369 A | 9/2013 |
| TW | 591265 B | 6/2004 |

OTHER PUBLICATIONS

China National Intellectual Property Administration, Office Action and Search Report Issued in Application No. 202011147010.X, Sep. 27, 2023, 13 pages. (Submitted with Partial Translation).

* cited by examiner

ARRAY SUBSTRATE AND DISPLAY DEVICE

CROSS REFERENCE TO RELATED APPLICATIONS

The present application is a U.S. National Phase of International Application No. PCT/CN2021/117701, entitled "ARRAY SUBSTRATE AND DISPLAY APPARATUS", and filed on Sep. 10, 2021. International Application No. PCT/CN2021/117701 claims priority to Chinese Patent Application No. 202011147010.X filed on Oct. 23, 2020. The entire contents of the above-listed applications are hereby incorporated by reference for all purposes.

TECHNICAL FIELD

The present disclosure relates to the field of display technology, in particular to an array substrate and a display device.

BACKGROUND

Along with the rapid development of the display technology as well as an increasing demand on a large-size screen, more and more large-size liquid crystal display devices have come into our life. However, in a large-size display panel, a data line is relatively long, so a charging rage for a subpixel at one end of the data line away from a driver Integrated Circuit (IC) is insufficient, and thereby the display quality of the large-size display device may be adversely affected.

SUMMARY

An object of the present disclosure is to provide an array substrate and a display device.

In order to achieve the above-mentioned purpose, the present disclosure provides the following technical solutions.

In one aspect, the present disclosure provides in some embodiments an array substrate, including a plurality of gate lines and a plurality of data lines arranged in a crosswise manner to define a plurality of subpixels in an array form, the plurality of subpixels is arranged in N columns, and the subpixels in each column are arranged in a first direction, where N is a positive integer; the plurality of data lines comprises one start data line, N−1 intermediate data lines and one end data line, the start data line is electrically coupled to target subpixels in sub-pixels in a first column, the N−1 intermediate data lines correspond to the subpixels in the first to (N−1)th columns respectively, each intermediate data line is electrically coupled to non-target subpixels in subpixels in a corresponding column and target subpixels in subpixels of a next column adjacent to the corresponding column, the end data line is electrically coupled to non-target subpixels in sub-pixels of an Nth column, the target subpixels are ones of odd-numbered subpixels and even-numbered subpixels, and the non-target subpixels are the other ones of the odd-numbered subpixels and the even-numbered subpixels; and the array substrate further comprises a first driving circuit and a second driving circuit, the first driving circuit is arranged at a first side of the plurality of data lines, the second driving circuit is arranged at a second side of the plurality of data lines, the first side is opposite to the second side in the first direction, the first driving circuit is electrically coupled to a first end of each of the plurality of data lines, a first end of the end data line is electrically coupled to a first end of the start data line, and the second driving circuit is electrically coupled to a second end of each of the plurality of data lines.

In a possible embodiment of the present disclosure, the array substrate further includes a first circuit board arranged at the first side and provided with a first connection line, and the first connection line is electrically coupled to the first end of the start data line and the first end of the end data line.

In a possible embodiment of the present disclosure, a second end of the end data line is electrically coupled to a second end of the start data line.

In a possible embodiment of the present disclosure, the array substrate further includes a second circuit board arranged at the second side and provided with a second connection line, and the second connection line is electrically coupled to the second end of the start data line and the second end of the end data line.

In a possible embodiment of the present disclosure, a line width of the first connection line and/or a line width of the second connection line is greater than a first threshold.

In a possible embodiment of the present disclosure, the first circuit board includes a plurality of first circuit sub-boards spliced together and arranged sequentially in a second direction, the second direction intersects the first direction, and the first connection line includes a plurality of first connection sub-lines arranged on the first circuit sub-boards respectively and electrically coupled to each other in an end-to-end manner; and/or the second circuit board includes a plurality of second circuit sub-boards spliced together and arranged sequentially in the second direction, and the second connection line includes a plurality of second connection sub-lines arranged on the second circuit sub-boards respectively and electrically coupled to each other in an end-to-end manner.

In a possible embodiment of the present disclosure, the N−1 intermediate data lines and the end data line are divided into M data line groups, the first driving circuit includes a plurality of first chip on films corresponding to the M data line groups respectively, each first chip on film includes first active data channels electrically coupled to the first ends of the data lines in a corresponding data line group respectively, and a first chip on film in the plurality of first chip on films closest to the start data line is further electrically coupled to the first end of the start data line. The second driving circuit includes a plurality of second chip on films corresponding to the M data line groups respectively, each second chip on film includes second active data channels electrically coupled to the second ends of the data lines in a corresponding data line group respectively, and a second chip on film in the plurality of second chip on films closest to the start data line further includes a second active data channel electrically coupled to the second end of the start data line.

In a possible embodiment of the present disclosure, the plurality of first chip on films is arranged sequentially in a second direction, the plurality of second chip on films is arranged sequentially in the second direction, and the second direction intersects the first direction.

In a possible embodiment of the present disclosure, the plurality of first chip on films is arranged between the first circuit board and the data line, the first chip on film in the plurality of first chip on films closest to the start data line further includes a conductive connection channel, one end of the first connection line is electrically coupled to the first end of the start data line through the conductive connection channel, in the first chip on film in the plurality of first chip on films closest to the end data line, a first active data channel electrically coupled to the first end of the end data line is a first multiplexing data channel, and the other end of the first connection line is electrically coupled to the first end of the end data line through the first multiplexing data channel. The plurality of second chip on films is arranged between the second circuit board and the data line, a second active data channel electrically coupled to the second end of the start data line is a second multiplexing data channel, one end of the second connection line is electrically coupled to the second end of the start data line through the second multiplexing data channel, in the second chip on film in the plurality of second chip on films closest to the end data line, a second active data channel electrically coupled to the end data line is a third multiplexing data channel, and the other end of the second connection line is electrically coupled to the second end of the end data line through the third multiplexing data channel.

In a possible embodiment of the present disclosure, the array substrate further includes a timing controller circuit arranged at a side of the array substrate away from the subpixels. The timing controller circuit is configured to apply a corresponding differential signal to the plurality of first chip on films through the first circuit board and apply a corresponding differential signal to the plurality of second chip on films through the second circuit board. Each first chip on film is configured to generate a corresponding data signal in accordance with the received differential signal, and write the data signal into the first end of the corresponding data line, each second chip on film is configured to generate a corresponding data signal in accordance with the received differential signal, and write the data signal into the second end of the corresponding data line, for a same data line, the data signal written into the first end is the same as the data signal written into the second end.

In a possible embodiment of the present disclosure, for a same data line, a signal delay time for the data signal written into the first end is the same as a signal delay time for the data signal written into the second end.

In a possible embodiment of the present disclosure, each first chip on film includes a first driving IC electrically coupled to the plurality of first active data channels in the first chip on film, and the first driving IC is configured to generate data signals corresponding to the first active data channels respectively in accordance with the received differential signal, and transmit the data signal to the first end of the corresponding data line through the corresponding first active data channel. Each second chip on film includes a second driving IC electrically coupled to the plurality of second active data channels in the second chip on film, and the second driving IC is configured to generate data signals corresponding to the second active data channels respectively in accordance with the received differential signal, and transmit the data signal to the second end of the corresponding data line through the corresponding second active data channel.

In a possible embodiment of the present disclosure, the first connection line is electrically coupled to the second connection line.

In a possible embodiment of the present disclosure, the data signal applied by the second driving IC to the second active data channel electrically coupled to the second end of the end data line is the same as the data signal applied by the second driving IC to the second active data channel electrically coupled to the second end of the start data line.

In a possible embodiment of the present disclosure, the first circuit board is provided with a plurality of first data transmission lines electrically coupled to the driving ICs in the plurality of first chip on films respectively, the second circuit board is provided with a plurality of second data transmission lines electrically coupled to the driving ICs in the plurality of second chip on films respectively, and the timing control circuit is electrically coupled to the plurality of first data transmission lines and the plurality of second data transmission lines.

In a possible embodiment of the present disclosure, the first chip on film and the second chip on film corresponding to a same data line group are arranged opposite to each other in the first direction.

In a possible embodiment of the present disclosure, in the plurality of data lines, the data signals applied to a same data line have same polarity, the data signals applied to adjacent data lines have opposite polarities, and the data signal applied to the start data line has same polarity as the data signal applied to the end data line.

In another aspect, the present disclosure provides in some embodiments a display device including the above-mentioned array substrate.

In a possible embodiment of the present disclosure, the display device further includes a color film substrate arranged opposite to the array substrate, and a liquid crystal layer arranged between the array substrate and the color film substrate.

In yet another aspect, the present disclosure provides in some embodiments a method for manufacturing an array substrate, including: forming a plurality of gate lines and a plurality of data lines, the plurality of gate lines and the plurality of data lines being arranged in a crosswise manner to define a plurality of subpixels in an array form, the plurality of subpixels being arranged in N columns, and the subpixels in each column being arranged in a first direction, N being a positive integer, the plurality of data lines including one start data line, N−1 intermediate data lines and one end data line, the start data line being electrically coupled to target subpixels in subpixels in a first column, the N−1 intermediate data lines corresponding to the subpixels in the first to (N−1)th columns respectively, each intermediate data line being electrically coupled to non-target subpixels in subpixels in a corresponding column and target subpixels in subpixels in a next column adjacent to the corresponding column, the end data line being electrically coupled to non-target subpixels in an $N^{th}$ column, the target subpixels being ones of odd-numbered subpixels and even-numbered subpixels, and the non-target subpixels being the other ones of the odd-numbered subpixels and the even-numbered subpixels; and forming a first driving circuit and a second driving circuit, the first driving circuit being arranged at a first side of the plurality of data lines, the second driving circuit being arranged at a second side of the plurality of data lines, the first side being opposite to the second side in the first direction, the first driving circuit being electrically coupled to first ends of the N−1 intermediate data lines and a first end of the end data line, the first end of the end data line being electrically coupled to a first end of the start data line, and the second driving circuit being electrically coupled to a second end of each of the plurality of data lines.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in conjunction with the drawings and embodiments.

Figure 1:
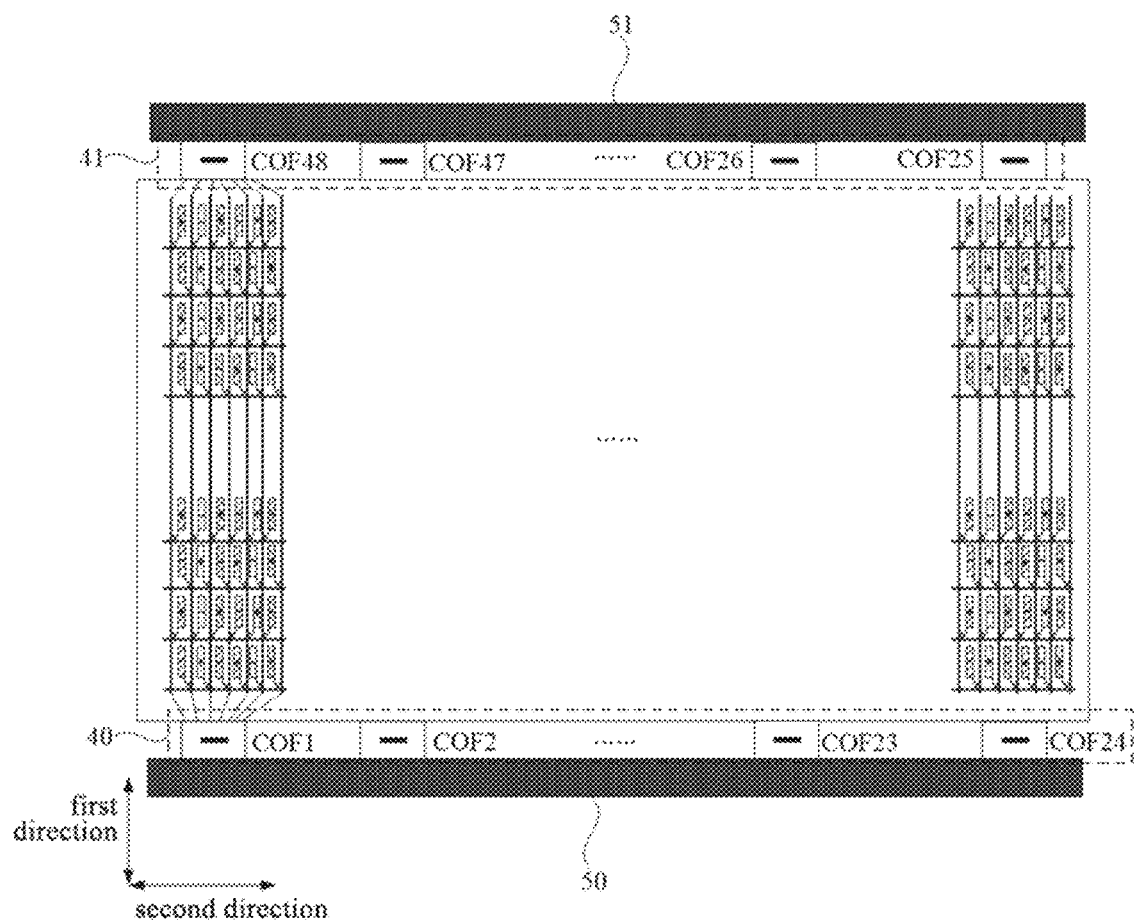
FIG. 1 is a schematic view showing an array substrate according to one embodiment of the present disclosure.
Figure 2:
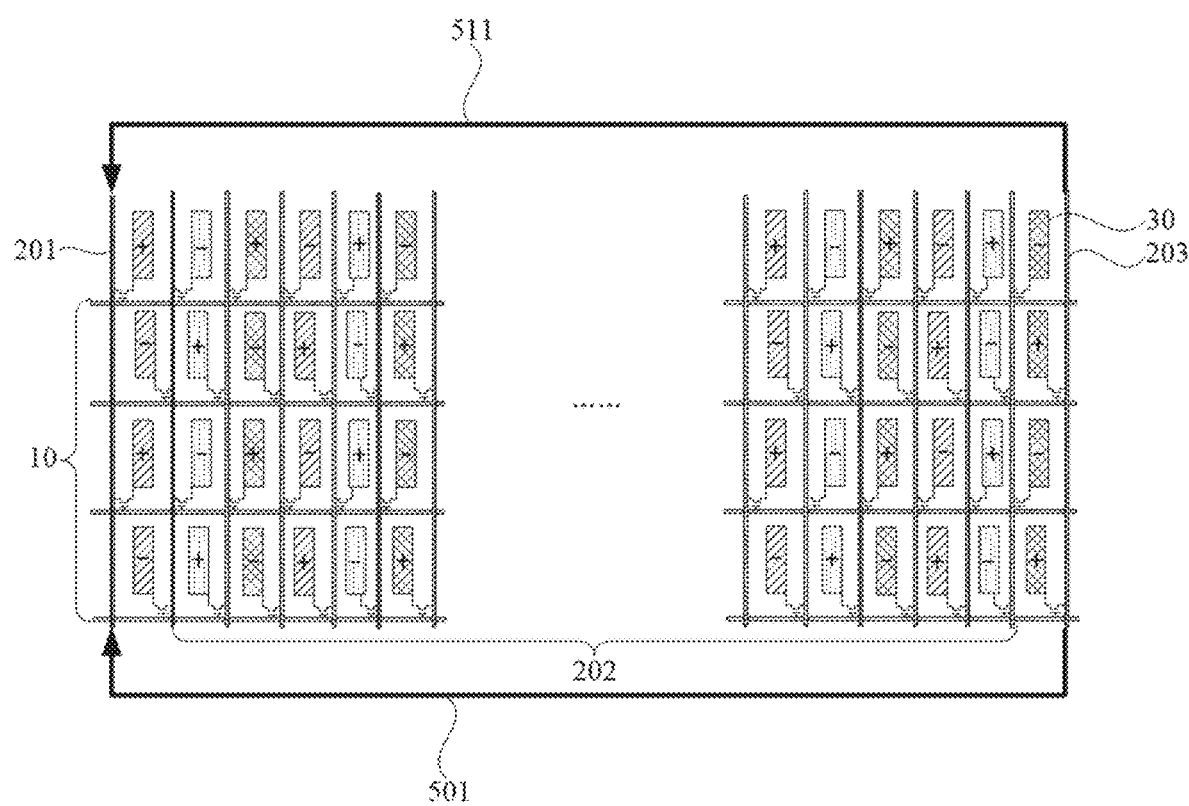
FIG. 2 is a schematic view showing a situation where a start data line is coupled to an end data line according to one embodiment of the present disclosure.

As shown in FIGS. 1 and 2, the present disclosure provides in some embodiments an array substrate, which includes a plurality of gate lines 10 and a plurality of data lines 201, 202, 203 arranged in a crosswise manner to define a plurality of subpixels 30 in an array form. The plurality of subpixels 30 is arranged in N columns, and the subpixels 30 in each column are arranged in a first direction, where N is a positive integer. The plurality of data lines includes one start data line 201, N−1 intermediate data lines 202 and one end data line 203, the start data line 201 is electrically coupled to target subpixels in a first column, the N−1 intermediate data lines 202 correspond to the subpixels in the first to (N−1)$^{th}$ columns respectively, each intermediate data line 202 is electrically coupled to non-target subpixels in a corresponding column and target subpixels in a next column adjacent to the corresponding column, the end data line 203 is electrically coupled to non-target subpixels in an N$^{th}$ column, the target subpixels are ones of odd-numbered subpixels and even-numbered subpixels, and the non-target subpixels are the other ones of the odd-numbered subpixels and the even-numbered subpixels. The array substrate further includes a first driving circuit 40 and a second driving circuit 41, the first driving circuit 40 is arranged at a first side of the plurality of data lines, the second driving circuit 41 is arranged at a second side of the plurality of data lines, the first side is opposite to the second side in the first direction, the first driving circuit 40 is electrically coupled to a first end of each of the plurality of data lines, a first end of the end data line 203 is electrically coupled to a first end of the start data line 201, and the second driving circuit 41 is electrically coupled to a second end of each of the plurality of data lines.

To be specific, the array substrate includes the plurality of gate lines 10 and the plurality of data lines. For example, at least a part of each data line extends in the first direction, and at least a part of each gate line 10 extends in a second direction. The first direction includes a horizontal direction, and the second direction includes a longitudinal direction.

The plurality of subpixels is arranged in an array form. The plurality of subpixels is divided into N columns arranged sequentially in the second direction, and the subpixels in each column are arranged sequentially in the first direction. The plurality of subpixels is also divided into multiple rows arranged sequentially in the first direction, and the subpixels in each row are arranged sequentially in the second direction.

The plurality of data lines includes the start data line 201, the N−1 intermediate data lines 202 and the end data line 203. For example, the start data line 201, the N−1 intermediate data lines 202 and the end data line 203 are arranged sequentially in the second direction.

For example, the start data line 201 is electrically coupled to the odd-numbered subpixels in the first column, the N−1 intermediate data lines 202 correspond to the subpixels in the first to the (N−1)th columns respectively, each intermediate data line 202 is electrically coupled to the even-numbered subpixels in a corresponding column and the odd-numbered subpixels in a next column adjacent to the corresponding column, the end data line 203 is electrically coupled to the even-numbered subpixels in the N$^{th}$ column.

For example, the start data line 201 is electrically coupled to the even-numbered subpixels in the first column, the N−1 intermediate data lines 202 correspond to the subpixels in the first to the (N−1)$^{th}$ columns respectively, each intermediate data line 202 is electrically coupled to the odd-numbered subpixels in a corresponding column and the even-numbered subpixels in a next column adjacent to the corresponding column, the end data line 203 is electrically coupled to the odd-numbered subpixels in the N$^{th}$ column.

For example, each intermediate data line 202 is arranged between the subpixels in a corresponding column and the subpixels in a next column adjacent to the corresponding column.

The array substrate further includes the first driving circuit 40 and the second driving circuit 41. For example, as shown in FIG. 1, the first driving circuit 40 is arranged at a lower bezel side of the array substrate, and the second driving circuit 41 is arranged at an upper bezel side of the array substrate.

The first driving circuit 40 is electrically coupled to the first ends of the plurality of data lines, and configured to write a data signal into the N−1 intermediate data lines 202 from the first ends of the N−1 intermediate data lines 202, and write a data signal into the end data line 203 from the first end of the end data line 203. Because the first end of the end data line 203 is electrically coupled to the first end of the start data line 201, the first driving circuit 40 is capable of writing a data signal into the start data line 201 from the first end of the start data line 201.

The second driving circuit 41 is electrically coupled to the second end of the start data line 201, the second ends of the N−1 intermediate data lines 202 and the second end of the end data line 203, and configured to write a data signal into the start data line 201 from the second end of the start data line 201, write a data signal into the N−1 intermediate data lines 202 from the second ends of the N−1 intermediate data lines 202, and write a data signal into the end data line 203 from the second end of the end data line 203.

For example, a specific driving process of the array substrate will be described as follows. The plurality of gate lines 10 is scanned progressively, and when each gate line 10 is scanned, the first driving circuit 40 and the second driving circuit 41 write corresponding data signals into the plurality of data lines. It should be appreciated that, for a same data line, the data signal written by the first driving circuit 40 is the same as the data signal written by the second driving circuit 41.

Based on the above-mentioned structure of the array substrate, the start data line 201 is electrically coupled to the target subpixels in the first column, the end data line 203 is electrically coupled to the non-target subpixels in the N$^{th}$ column, and the first end of the end data line 203 is electrically coupled to the first end of the start data line 201. In addition, the first driving circuit 40 and the second driving circuit 41 are arranged at the first side and the second side of the plurality of data lines respectively, so that a same data signal is received by each data line at its two ends from the first driving circuit 40 and the second driving circuit 41.

Hence, according to the array substrate in the embodiments of the present disclosure, it is able to drive the array substrate at two sides in an extension direction of the data line, and charge each data line at both ends, thereby to drive each subpixel through the first driving circuit 40 and the second driving circuit 41 simultaneously, and improve a charging rate of each subpixel as well as the display quality of a display device.

As shown in FIGS. 1 and 2, in some embodiments of the present disclosure, the array substrate further includes a first circuit board 50 arranged at the first side and provided with a first connection line 501, and the first connection line 501 is electrically coupled to the first end of the start data line 201 and the first end of the end data line 203.

To be specific, the array substrate includes a base substrate on which the plurality of gate lines 10, the plurality of data lines and the plurality of subpixels are formed. The array substrate further includes the first circuit board 50 arranged at a first side of the base substrate.

The first circuit board 50 is provided with the first connection line 501, at least a part of the first connection line 501 extends in the second direction, one end of the first connection line 501 is electrically coupled to the first end of the start data line 201, and the other end of the first connection line 501 is electrically coupled to the first end of the end data line 203.

Through the first connection line 501 on the first circuit board 50, it is able to ensure excellent connection performance between the first end of the start data line 201 and the first end of the end data line 203, and prevent the occurrence of a short circuit between the first connection line 501 and the other signal line on the base substrate in a better manner, thereby to ensure the performance of the display device.

As shown in FIGS. 1 and 2, in some embodiments of the present disclosure, the second end of the end data line 203 is electrically coupled to the second end of the start data line 201.

To be specific, through the above arrangement, the second end of the start data line is capable of receiving a data signal from a second chip on film coupled thereto, as well as a data signal from a second chip on film coupled to the second end of the end data line 203. In addition, the first end of the start data line is capable of receiving a data signal from a first chip on film coupled to the first end of the end data line 203. Hence, based on the above arrangement, it is able to provide each subpixel electrically coupled to the start data line with a higher charging rate.

As shown in FIGS. 1 and 2, in some embodiments of the present disclosure, the array substrate further includes a second circuit board 51 arranged at the second side and provided with a second connection line 511, and the second connection line 511 is electrically coupled to the second end of the start data line 201 and the second end of the end data line 203.

To be specific, the array substrate includes a base substrate on which the plurality of gate lines 10, the plurality of data lines and the plurality of subpixels are formed. The array substrate further includes the second circuit board 51 arranged at a second side of the base substrate.

The second circuit board 51 is provided with the second connection line 511, at least a part of the second connection line 511 extends in the second direction, one end of the second connection line 511 is electrically coupled to the second end of the start data line 201, and the other end of the second connection line 511 is electrically coupled to the second end of the end data line 203.

Through the second connection line 511 on the second circuit board 51, it is able to ensure excellent connection performance between the second end of the start data line 201 and the second end of the end data line 203, and prevent the occurrence of a short circuit between the second connection line 511 and the other signal line on the base substrate in a better manner, thereby to ensure the performance of the display device.

In some embodiments of the present disclosure, a line width of the first connection line 501 and/or a line width of the second connection line 511 are greater than a first threshold.

For example, the first threshold is equal to 0.23 mm.

For example, the line width of the first connection line 501 and/or the line width of the second connection line 511 are equal to 0.24 mm.

When the line width of the first connection line 501 and/or the line width of the second connection line 511 are greater than the first threshold, it is able to provide the first connection line 501 and/or the second connection line 511 with a small resistance as well as a small IR drop, thereby to ensure the consistency of the data signals written into the start data line. In addition, it is able to reduce a delay time for the first connection line 501 and/or the second connection line 511, thereby to ensure the charging rate of the subpixel coupled to the start data line.

Figure 3:
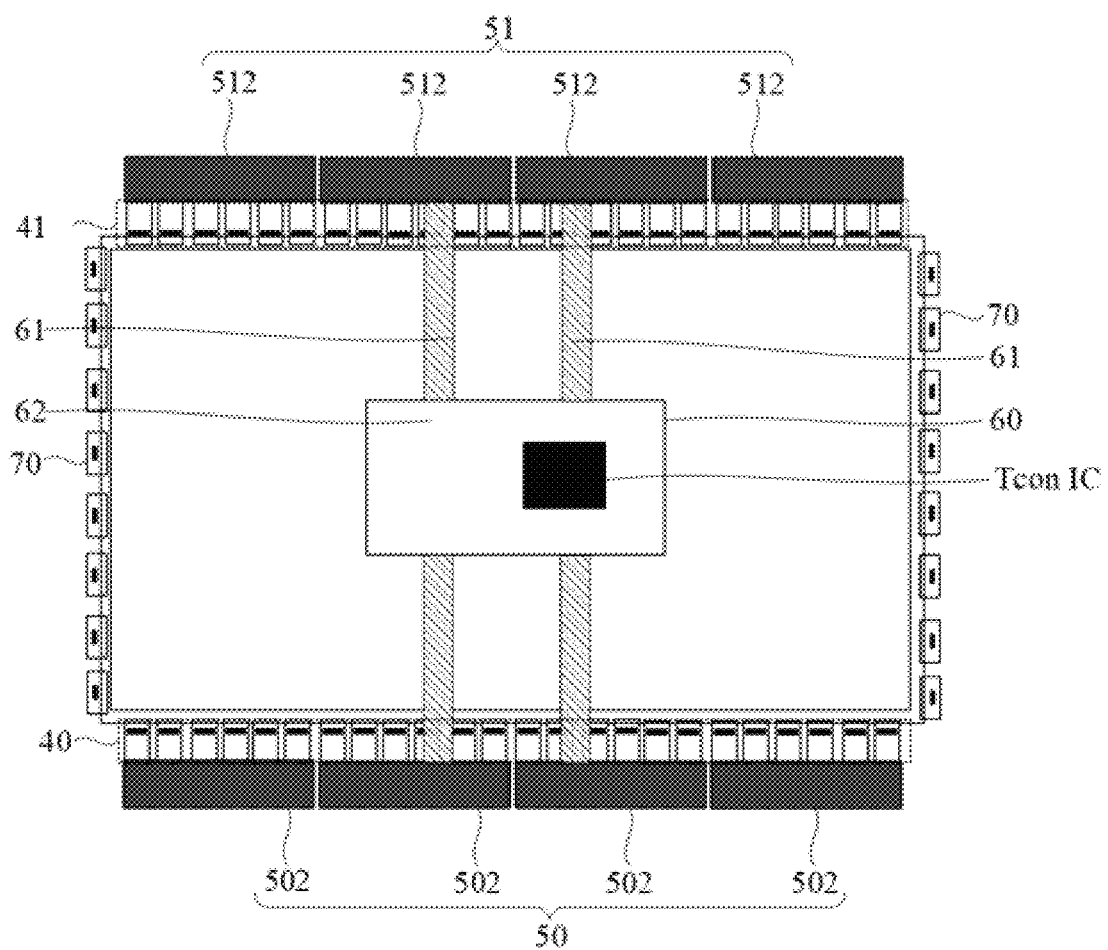
FIG. 3 is another schematic view showing the array substrate according to one embodiment of the present disclosure.

As shown in FIG. 3, in some embodiments of the present disclosure, the first circuit board 50 includes a plurality of first circuit sub-boards 502 spliced together and arranged sequentially in a second direction, the second direction intersects the first direction, and the first connection line 501 includes a plurality of first connection sub-lines arranged on the first circuit sub-boards 502 respectively and electrically coupled to each other in an end-to-end manner; and/or the second circuit board 51 includes a plurality of second circuit sub-boards 512 spliced together and arranged sequentially in the second direction, and the second connection line 511 includes a plurality of second connection sub-lines arranged on the second circuit sub-boards 512 respectively and electrically coupled to each other in an end-to-end manner.

To be specific, each of the first circuit board 50 and the second circuit board 51 may include, but not limited to, a Printed Circuit Board (XPCB).

When a size of each of the first circuit board 50 and the second circuit board 51 does not meet the requirement on a large-size array substrate due to the limitation of a manufacture process, the first circuit board 50 includes the plurality of first circuit sub-boards 502 spliced together, and the second circuit board 51 includes the plurality of second circuit sub-boards 512 spliced together.

For example, the plurality of first circuit sub-boards 502 is arranged sequentially in the second direction, and the first connection line 501 includes the plurality of first connection sub-lines arranged on the first circuit sub-boards 502 respectively. The plurality of first connection sub-lines are electrically coupled to each other sequentially through flexible circuit boards, and the adjacent first circuit sub-boards 502 are coupled to each other through the flexible circuit board.

For example, the plurality of second circuit sub-boards 512 is arranged sequentially in the second direction, and the second connection line 511 includes the plurality of second connection sub-lines arranged on the second circuit sub-boards 512 respectively. The plurality of second connection sub-lines are electrically coupled to each other sequentially through flexible circuit boards, and the adjacent second circuit sub-boards 512 are coupled to each other through the flexible circuit board.

It should be appreciated that, FIG. 3 shows the second driving circuit 41 and the first driving circuit 40 arranged at an upper side and a lower side of the array substrate respectively. The first driving circuit 40 includes a plurality of first chip on films, and the second driving circuit 41 includes a plurality of second chip on films. In FIG. 3, each black block on the first chip on films and the second chip on films is a driver IC. A TCON IC in the array substrate is arranged on a support circuit board 60, and the support circuit board 60 is fixed onto a back surface of the array substrate through a screw. The TCON IC is electrically coupled to the first circuit board 50 and the second circuit board 51 through a signal line 61 and a circuit structure 62 on the support circuit board 60.

The array substrate further includes a third driving circuit and a fourth driving circuit arranged at a left side and a right side respectively, each of the third driving circuit and the fourth driving circuit includes a plurality of third chip on films 70, and each third chip on film is configured to apply a scanning signal to the gate line in the array substrate. Through the third driving circuit and the fourth driving circuit at the left side and the right side of the array substrate respectively, it is able to drive a same gate line at the left side and the right side simultaneously.

As shown in FIGS. 1 and 2, in some embodiments of the present disclosure, the N−1 intermediate data lines 202 and the end data line 203 are divided into M data line groups. The first driving circuit 40 includes a plurality of first chip on films (e.g., COF1 to COF24) corresponding to the M data line groups respectively, each first chip on film includes first active data channels electrically coupled to the first ends of the data lines in a corresponding data line group respectively, and a first chip on film (e.g., COF1) in the plurality of first chip on films closest to the start data line 201 is further electrically coupled to the first end of the start data line. The second driving circuit 41 includes a plurality of second chip on films (e.g., COF25 to COF48) corresponding to the M data line groups respectively, each second chip on film includes second active data channels electrically coupled to the second ends of the data lines in a corresponding data line group respectively, and a second chip on film in the plurality of second chip on films closest to the start data line further includes a second active data channel electrically coupled to the second end of the start data line.

For example, the first driving circuit 40 includes the plurality of first chip on films, and each first chip on film is electrically coupled to the first ends of the data lines in a corresponding data line group through a flexible circuit board.

For example, the second driving circuit 41 includes the plurality of second chip on films, and each second chip on film is electrically coupled to the second ends of the data lines in a corresponding data line group through a flexible circuit board.

For example, a driving IC is arranged on each of the first chip on films and the second chip on films.

As shown in FIG. 1, taking a 86-inch 4 k single gate (i.e., the subpixels in one row correspond to one gate line) product as an example, 48 COFs are arranged evenly at the first side and the second side of the array substrate.

It should be appreciated that, in Z-inversion architecture, when and only when a data line driving circuit is arranged at a single side of the array substrate, the COF closest to the start data line is provided with one more active data channel than the other COFs, and this active data channel is used to apply the data signal to the start data line. When the data line driving circuits are arranged at both sides (i.e., the first side and the second side) of the array substrate, the COF closest to the start data line at the second side is provided with one more active data channel than the other COFs, and this active data channel is used to apply the data signal to the second end of the start data line.

Figure 4:
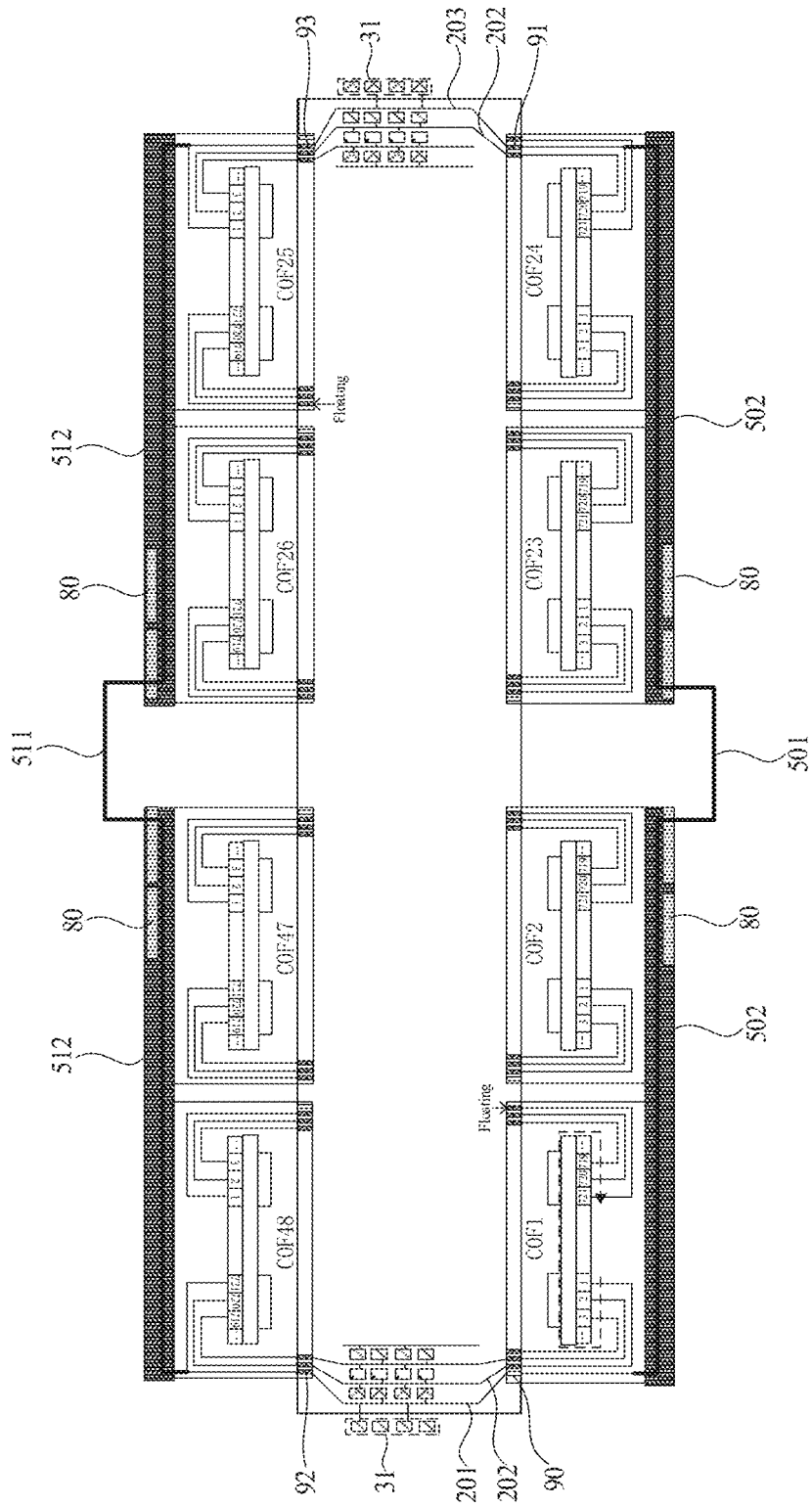
FIG. 4 is yet another schematic view showing the array substrate according to one embodiment of the present disclosure.

In FIGS. 1 and 4, COF1 and COF48 are arranged at the first side and the second side of the array substrate respectively on the left, and COF24 and COF25 are arranged at the first side and the second side of the array substrate respectively on the right. Each of COF1 to COF48 includes a plurality of data channels. For example, the plurality of data channels included by COF1 to COF47 includes 480 active data channels, and the plurality of data channels included by COF48 includes 481 active data channels. It should be appreciated that, the active data channel refers to a data channel through which a data signal is received from the driving IC in the chip on film to which the data channel belongs.

Each data line group includes 480 data lines, the active data channels included by any COF in COF1 to COF24 are electrically coupled to the first ends of the data lines in the corresponding data line group respectively, the active data channels included by any COF in COF25 to COF47 are electrically coupled to the second ends of the data lines in the corresponding data line group respectively, and the active data channels included by COF48 are electrically coupled to the second ends of the data lines in the corresponding data line group and the second end of the start data line respectively.

Within a same frame, the start data line has same polarity as the end data line 203. The end data line 203 coupled to COF24 and COF25 is merely electrically coupled to the even-numbered subpixels in a corresponding column, and the data in odd-numbered rows of COF24 and COF25 is not used. The start data line coupled to COF48 is merely electrically coupled to the odd-numbered subpixels in a corresponding column, and the data in even-numbered rows of COF48 is not used. Hence, the data in the odd-numbered rows of COF24 is transmitted to the first end of the start data line through the first connection line 501 on the first circuit board 50, and the data in the odd-numbered rows of COF25 is transmitted to the second end of the start data line through the second connection line 511 on the second circuit board 51, so as to charge the data line through the two COFs at both sides of the array substrate simultaneously. In addition, the start data line receives the same data signal from COF24, COF25 and COF48 simultaneously, so its charging rate is greater than that of the other data lines.

As shown in FIGS. 1 and 2, in some embodiments of the present disclosure, the plurality of first chip on films is arranged sequentially in a second direction, the plurality of second chip on films is arranged sequentially in the second direction, and the second direction intersects the first direction.

To be specific, based on the above arrangement, it is able to effectively reduce a distance between the first chip on film and a corresponding data line group, thereby to reduce a bezel width of the array substrate and improve the connection performance between the first chip on film and the data line. Identically, based on the above arrangement, it is able to effectively reduce a distance between the second chip on film and a corresponding data line group, thereby to improve the connection performance between the second chip on film and the data line, and further reduce the bezel width of the array substrate.

There are various positional relationships between the first chip on film and the first circuit board 50, and various positional relationships between the second chip on film and the second circuit board 51. As shown in FIG. 1, in some embodiments of the present disclosure, the plurality of first chip on films is arranged between the first circuit board 50 and the data line, and the plurality of second chip on films is arranged between the second circuit board 51 and the data line.

For example, the first circuit board 50 is electrically coupled to the plurality of first chip on films through a plurality of flexible circuit boards, and the second circuit board 51 is electrically coupled to the plurality of second chip on films through a plurality of flexible circuit boards.

As shown in FIGS. 1 and 4, in some embodiments of the present disclosure, the plurality of first chip on films is arranged between the first circuit board 50 and the data line, the first chip on film (e.g., COF1) in the plurality of first chip on films closest to the start data line 201 further includes a conductive connection channel 90, and one end of the first connection line 501 is electrically coupled to the first end of the start data line 201 through the conductive connection channel 90. In the first chip on film (e.g., COF24) in the plurality of first chip on films closest to the end data line 203, a first active data channel electrically coupled to the first end of the end data line 203 is a first multiplexing data channel 91, and the other end of the first connection line 501 is electrically coupled to the first end of the end data line 203 through the first multiplexing data channel 91.

The plurality of second chip on films is arranged between the second circuit board 51 and the data line, a second active data channel electrically coupled to the second end of the start data line 201 is a second multiplexing data channel 92, and one end of the second connection line 511 is electrically coupled to the second end of the start data line 201 through the second multiplexing data channel 92. In the second chip on film (COF25) in the plurality of second chip on films closest to the end data line 203, a second active data channel electrically coupled to the end data line 203 is a third multiplexing data channel 93, and the other end of the second connection line 511 is electrically coupled to the second end of the end data line 203 through the third multiplexing data channel 93.

To be specific, COF1 further includes the conductive connection channel 90, and the conductive connection channel 90 does not receive the data signal from the IC in COF1. One end of the first connection line 501 is electrically coupled to the first end of the start data line 201 through the conductive connection channel 90, so that the first end of the start data line 201 receives the data signal from the IC in COF24.

The first active data channel in COF24 electrically coupled to the first end of the end data line 203 is the first multiplexing data channel 91, and the first multiplexing data channel 91 receives the data signal from the IC in COF24. In addition, the other end of the first connection line 501 is electrically coupled to the first end of the end data line 203 through the first multiplexing data channel 91, so that the first end of the end data line 203 is electrically coupled to the first end of the start data line 201.

The second active data channel in COF48 electrically coupled to the second end of the start data line 201 is the second multiplexing data channel 92, and the second multiplexing data channel 92 receives the data signal from the IC in COF48. One end of the second connection line 511 is electrically coupled to the second end of the start data line 201 through the second multiplexing data channel 92.

The second active data channel in COF25 electrically coupled to the second end of the end data line 203 is the third multiplexing data channel 93, and the third multiplexing data channel 93 receives the data signal from the IC in COF25. In addition, the other end of the second connection line 511 is electrically coupled to the second end of the end data line 203 through the third multiplexing data channel 93, so that the second end of the end data line 203 is electrically coupled to the second end of the start data line 201.

It should be appreciated that, FIG. 4 further shows a dummy subpixel 31 and a patch board 80. For example, the patch board 80 is coupled to an adjacent circuit board through a flexible circuit board, or electrically coupled to a TCON board. Apart from the active data channels, each COF further include inactive data channels, and these inactive data channels are not electrically coupled to the data lines, i.e., they do not receive the data signals from the ICs. For example, each COF includes 721 data channels, e.g., 121 to 240 inactive data channels and 481 to 600 active data channels. For example, in each of COF1 to COF47, a $721^{st}$ channel is in a floating state.

In some embodiments of the present disclosure, the array substrate further includes a timing control circuit (Tcon IC) arranged at a side of the array substrate away from the subpixels. The timing controller circuit is configured to apply a corresponding differential signal to the plurality of first chip on films through the first circuit board 50 and apply a corresponding differential signal to the plurality of second chip on films through the second circuit board 51. Each first chip on film is configured to generate a corresponding data signal in accordance with the received differential signal, and write the data signal into the first end of the corresponding data line. Each second chip on film is configured to generate a corresponding data signal in accordance with the received differential signal, and write the data signal into the second end of the corresponding data line. For a same data line, the data signal written into the first end is the same as the data signal written into the second end.

To be specific, after the array substrate is powered on, the timing control circuit applies the differential signal to the plurality of first chip on films through the first circuit board 50, and each first chip on film generates the data signals in accordance with the received differential signal and writes the data signals into the first ends of the corresponding data lines. The timing control circuit further applies the differential signal to the plurality of second chip on films through the second circuit board 51, and each second chip on film generates the data signals in accordance with the received differential signal and writes the data signals into the second ends of the corresponding data lines. For a same data line, the data signal written into the first end is the same as the data signal written into the second end, so as to charge the data line at two sides.

In some embodiments of the present disclosure, for a same data line, a signal delay time for the data signal written into the first end is the same as a signal delay time for the data signal written into the second end.

Based on the above arrangement, it is able to ensure a charging effect for the data line at two sides in a better manner.

In some embodiments of the present disclosure, the timing control circuit is arranged in the middle of the array substrate, and a distance between the timing control circuit and the first circuit board 50 is substantially equal to a distance between the timing control circuit and the second circuit board 51.

Based on the above arrangement, the data signal applied by the timing control circuit to the first circuit board 50 has a substantially same IR drop and a substantially same delay as the data signal applied by the timing control circuit to the second circuit board 51, so as to ensure the charging effect for the data line at two sides in a better manner.

In some embodiments of the present disclosure, each first chip on film includes a first driving IC electrically coupled to the plurality of first active data channels in the first chip on film, and the first driving IC is configured to generate data signals corresponding to the first active data channels respectively in accordance with the received differential signal, and transmit the data signal to the first end of the corresponding data line through the corresponding first active data channel. Each second chip on film includes a second driving IC electrically coupled to the plurality of second active data channels in the second chip on film, and the second driving IC is configured to generate data signals corresponding to the second active data channels respectively in accordance with the received differential signal, and transmit the data signal to the second end of the corresponding data line through the corresponding second active data channel.

For example, each first chip on film has a same structure as the second chip on film, i.e., each first chip on film includes a same driving IC and the same quantity of data channels as the second chip on film.

It should be appreciated that, the plurality of data channels in each of the first chip on films and the second chip on films include active data channels and inactive data channels, and the active data channel refers to a data channel coupled to the data line and configured to transmit the data signal to the data line.

For example, the quantity B of the data lines in the array substrate=a multiple of 3+1=C*n+1, where the multiple of 3 refers to a multiple of three subpixels RGB, and C refers to the quantity of the first active data channels in the first chip on film.

Apart from the second chip on film (e.g., COF48) closest to the start data line, in the other second chip on films (e.g., COF25 to COF47) and the first chip on films (e.g., COF1 to COF24), the quantity of active data channels in the plurality of data channels is the same.

In the second chip on film (e.g., COF48) closest to the start data line, the quantity of active data channels in the plurality of data channels is one more than the quantity of active data channels in the first chip on film.

The timing control circuit applies the differential signal to the plurality of first chip on films through the first circuit board 50, and the driving IC in each first chip on film generates the plurality of data signals in accordance with the received differential signal and writes the data signals into the first ends of the corresponding data lines through the plurality of first active data channels in the first chip on film. The timing control circuit further applies the differential signal to the plurality of second chip on films through the second circuit board 51, and the driving IC in each second chip on film generates the plurality of data signals in accordance with the received differential signal and writes the data signals into the second ends of the corresponding data lines through the plurality of second active data channels in the second chip on film.

In some embodiments of the present disclosure, the data signal applied to the start data signal is the same as the data signal applied to the end data line, so the first connection line is electrically coupled to the second connection line, so as to charge the data line at both sides in a better manner. In addition, when the first connection line is electrically coupled to the second connection line, it is able to improve the uniformity and stability of the signal.

In some embodiments of the present disclosure, the data signal applied by the second driving IC to the second active data channel electrically coupled to the second end of the end data line 203 is the same as the data signal applied by the second driving IC to the second active data channel electrically coupled to the second end of the start data line 201.

Based on the above arrangement, it is able to provide each subpixel electrically coupled to the start data line with a higher charging rate.

In some embodiments of the present disclosure, the first circuit board 50 is provided with a plurality of first data transmission lines electrically coupled to the driving ICs in the plurality of first chip on films respectively, the second circuit board 51 is provided with a plurality of second data transmission lines electrically coupled to the driving ICs in the plurality of second chip on films respectively, and the timing control circuit is electrically coupled to the plurality of first data transmission lines and the plurality of second data transmission lines.

For example, the plurality of first data channels is arranged at a layer different from the first connection line 501, and the plurality of second data channels is arranged at a layer different from the second connection line 511.

To be specific, the timing control circuit applies the differential signal to the driving ICs in the plurality of first chip on films through the plurality of first data transmission lines, and applies the differential signal to the driving ICs in the plurality of second chip on films through the plurality of second data transmission lines.

For example, the quantity of first data transmission lines (or the second data transmission lines) coupled to the driving IC in each first chip on film (or each second chip on film) is smaller than the quantity of active data channels in the first chip on film (or the second chip on film).

For example, at least a part of the first connection line 501 extends in the second direction, at least a part of the second connection line 511 extends in the second direction, at least a part of each first data transmission line extends in the first direction, and at least a part of each second data transmission line extends in the first direction.

Through the arrangement of the plurality of first data channels at a layer different from the first connection line 501, it is able to prevent the occurrence of a short circuit between the first data channel and the first connection line 501, and through the arrangement of the plurality of second data channels at a layer different from the second connection line 511, it is able to prevent the occurrence of a short circuit between the second data channel and the second connection line 511.

As shown in FIGS. 1 and 4, in some embodiments of the present disclosure, the first chip on film and the second chip on film corresponding to a same data line group are arranged opposite to each other in the first direction.

For example, COF1 and COF48 are arranged opposite to each other in the first direction, and COF24 and COF25 are arranged opposite to each other in the first direction.

Based on the above arrangement, it is able to reduce a layout space for the COFs at a periphery of the array substrate, thereby to reduce the bezel width of the array substrate.

As shown in FIG. 1, in some embodiments of the present disclosure, the same data signal is written by the first driving circuit 40 and the second driving circuit 41 simultaneously into the same data line.

To be specific, a time point when the data signal is written by the first driving circuit 40 and the second driving circuit 41 into the data line may be controlled according to the practical need. When the same data signal is written by the first driving circuit 40 and the second driving circuit 41 simultaneously into the same data line, it is able for each data line to receive the same data signal at a same time point, thereby to charge the subpixels coupled to each data line sufficiently, i.e., to achieve a better charging effect.

As shown in FIGS. 1 and 2, in some embodiments of the present disclosure, in the plurality of data lines, the data signals applied to a same data line have same polarity, the data signals applied to adjacent data lines have opposite polarity, and the data signal applied to the start data line 201 has same polarity as the data signal applied to the end data line 203.

Based on the above arrangement, the array substrate has the Z-inversion architecture, so when a liquid crystal display device includes the array substrate, it is able to prevent liquid crystal molecules in the display device from being maintained at the same polarity within a long time period, thereby to prolong a service life of the liquid crystal display device.

In addition, when the data signal applied to the start data line 201 has the same polarity as the data signal applied to the end data line 203, it is able to ensure that the data signals received by the start data line 201 and the end data line 203 have the same polarity in the case that the start data line 201 is electrically coupled to the end data line 203.

As shown in FIGS. 1 and 2, in some embodiments of the present disclosure, the plurality of subpixels is arranged in a plurality of rows, the subpixels in each row are arranged in the second direction intersecting the first direction, the plurality of gate lines 10 correspond to the subpixels in the plurality of rows respectively, and each gate line 10 is electrically coupled to the subpixels in a corresponding row.

To be specific, each gate line 10 is electrically coupled to the subpixels in a corresponding row, so as to control a data write-in time for the subpixels in the row.

When the writing of the data signal into the subpixels in a corresponding row is controlled by the gate line 10, the subpixels in the row receive the same data signal from the first driving circuit 40 and the second driving circuit 41 simultaneously.

In some embodiments of the present disclosure, the subpixels in N columns include red subpixels in a plurality of columns, green subpixels in a plurality of columns and blue subpixels in a plurality of columns. The columns of red subpixels, the columns of green subpixels and the columns of blue subpixels are arranged in turn in the second direction intersecting the first direction.

When the array substrate with the above-mentioned structure is applied to the display device, it is able to improve the color uniformity of the display device in a better manner.

The present disclosure further provides in some embodiments a display device which includes the above-mentioned array substrate.

According to the embodiments of the present disclosure, the start data line 201 is electrically coupled to the target subpixels in the first column, the end data line 203 is electrically coupled to the non-target subpixels in the $N^{th}$ column, and the first end of the end data line 203 is electrically coupled to the first end of the start data line 201. In addition, the first driving circuit 40 and the second driving circuit 41 are arranged at the first side and the second side of the plurality of data lines respectively, so that a same data signal is received by each data line at its two ends from the first driving circuit 40 and the second driving circuit 41. Hence, according to the array substrate in the embodiments of the present disclosure, it is able to drive the array substrate at two sides in an extension direction of the data line, and charge each data line at both ends, thereby to drive each subpixel through the first driving circuit 40 and the second driving circuit 41 simultaneously, and improve a charging rate of each subpixel as well as the display quality of the display device.

Hence, when the display device includes the above-mentioned array substrate, it also has the above-mentioned beneficial effects, which will not be particularly defined herein.

It should be appreciated that, the display device may be a product or member having a display function, e.g., a television, a television with a built-in touch substrate, a display, a digital photo frame, a mobile phone, or a tablet computer. The display device further includes a flexible circuit board, a printed circuit board and a back plate.

In some embodiments of the present disclosure, the display device further includes a color film substrate arranged opposite to the array substrate, and a liquid crystal layer arranged between the array substrate and the color film substrate.

To be specific, the color film substrate includes a plurality of color resistor patterns corresponding to the subpixels in the array substrate. After the color film substrate has been arranged opposite to the array substrate to form a cell, the liquid crystal molecules are injected into the cell to form the liquid crystal layer. The liquid crystal molecules in the liquid crystal layer are capable of being deflected under the control of a driving electric field formed between the array substrate and the color film substrate, so as to achieve a display function of the display device.

In some embodiments of the present disclosure, the display device further includes a touch substrate.

For example, the touch substrate is arranged between the array substrate and the color film substrate (i.e., the display device is an in-cell touch product), or at a side of the color film substrate away from the array substrate (i.e., the display device is an on-cell touch product).

The present disclosure further provides in some embodiments a method for manufacturing the above-mentioned array substrate, which includes: forming the plurality of gate lines 10 and the plurality of data lines, the plurality of gate lines 10 and the plurality of data lines being arranged in a crosswise manner to define a plurality of subpixels in an array form, the plurality of subpixels being arranged in N columns, and the subpixels in each column being arranged in a first direction, N being a positive integer, the plurality of data lines including the start data line 291, the N−1 intermediate data lines 202 and the end data line 203, the start data line 201 being electrically coupled to target subpixels in a first column, the N−1 intermediate data lines 202 corresponding to the subpixels in the first to $(N-1)^{th}$ columns respectively, each intermediate data line 202 being electrically coupled to non-target subpixels in a corresponding column and target subpixels in a next column adjacent to the corresponding column, the end data line 203 being electrically coupled to non-target subpixels in an $N^{th}$ column, the target subpixels being ones of odd-numbered subpixels and even-numbered subpixels, and the non-target subpixels being the other ones of the odd-numbered subpixels and the even-numbered subpixels; and forming the first driving circuit 40 and the second driving circuit 41, the first driving circuit 40 being arranged at a first side of the plurality of data lines, the second driving circuit 41 being arranged at a second side of the plurality of data lines, the first side being opposite to the second side in the first direction, the first driving circuit 40 being electrically coupled to first ends of the N−1 intermediate data lines 202 and a first end of the end data line 203, the first end of the end data line 203 being electrically coupled to a first end of the start data line 301, and the second driving circuit 41 being electrically coupled to a second end of each of the plurality of data lines.

According to the array substrate manufactured through the above-mentioned method in the embodiments of the present disclosure, the start data line 201 is electrically coupled to the target subpixels in the first column, the end data line 203 is electrically coupled to the non-target subpixels in the $N^{th}$ column, and the first end of the end data line 203 is electrically coupled to the first end of the start data line 201. In addition, the first driving circuit 40 and the second driving circuit 41 are arranged at the first side and the second side of the plurality of data lines respectively, so that a same data signal is received by each data line at its two ends from the first driving circuit 40 and the second driving circuit 41. Hence, according to the array substrate in the embodiments of the present disclosure, it is able to drive the array substrate at two sides in an extension direction of the data line, and charge each data line at both ends, thereby to drive each subpixel through the first driving circuit 40 and the second driving circuit 41 simultaneously, and improve a charging rate of each subpixel as well as the display quality of a display device.

It should be appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. An array substrate, comprising a plurality of gate lines and a plurality of data lines arranged in a crosswise manner to define a plurality of subpixels in an array form, wherein
the plurality of subpixels is arranged in N columns, and the subpixels in each column are arranged in a first direction, where N is a positive integer;
the plurality of data lines comprises one start data line, N−1 intermediate data lines and one end data line, the start data line is electrically coupled to target subpixels in sub-pixels in a first column, the N−1 intermediate data lines correspond to the subpixels in the first to $(N-1)^{th}$ columns respectively, each intermediate data line is electrically coupled to non-target subpixels in subpixels in a corresponding column and target subpixels in subpixels of a next column adjacent to the corresponding column, the end data line is electrically coupled to non-target subpixels in sub-pixels of an $N^{th}$ column, the target subpixels are ones of odd-numbered subpixels and even-numbered subpixels, and the non-target subpixels are the other ones of the odd-numbered subpixels and the even-numbered subpixels; and
the array substrate further comprises a first driving circuit and a second driving circuit, the first driving circuit is arranged at a first side of the plurality of data lines, the second driving circuit is arranged at a second side of the plurality of data lines, the first side is opposite to the second side in the first direction, the first driving circuit is electrically coupled to a first end of each of the plurality of data lines, a first end of the end data line is electrically coupled to a first end of the start data line, and the second driving circuit is electrically coupled to a second end of each of the plurality of data lines;
the array substrate further comprises a first circuit board arranged at the first side and provided with a first connection line, wherein the first connection line is electrically coupled to the first end of the start data line and the first end of the end data line;
wherein a second end of the end data line is electrically coupled to a second end of the start data line;
the array substrate further comprises a second circuit board arranged at the second side and provided with a second connection line, wherein the second connection line is electrically coupled to the second end of the start data line and the second end of the end data line;
wherein the first circuit board comprises a plurality of first circuit sub-boards spliced together and arranged sequentially in a second direction, the second direction intersects the first direction, and the first connection line comprises a plurality of first connection sub-lines arranged on the first circuit sub-boards respectively and electrically coupled to each other in an end-to-end manner; and/or
the second circuit board comprises a plurality of second circuit sub-boards spliced together and arranged sequentially in the second direction, and the second connection line comprises a plurality of second connection sub-lines arranged on the second circuit sub-boards respectively and electrically coupled to each other in an end-to-end manner.

2. The array substrate according to claim 1, wherein a line width of the first connection line and/or a line width of the second connection line is greater than a first threshold, and wherein the first threshold is equal to 0.23 mm.

3. The array substrate according to claim 1, wherein the N−1 intermediate data lines and the end data line are divided into M data line groups;

the first driving circuit comprises a plurality of first chip on films corresponding to the M data line groups respectively, each first chip on film comprises first active data channels electrically coupled to the first ends of the data lines in a corresponding data line group respectively, a first chip on film in the plurality of first chip on films closest to the start data line further comprises a conductive connection channel, one end of the first connection line is electrically coupled to the first end of the start data line through the conductive connection channel; a driving Integrated Circuit (IC) in the first chip on film in the plurality of first chip on films closest to the start data line does not provide a data signal to the conductive connection channel; and the second driving circuit comprises a plurality of second chip on films corresponding to the M data line groups respectively, each second chip on film comprises second active data channels electrically coupled to the second ends of the data lines in a corresponding data line group respectively, wherein the second active data channel comprised in a second chip on film in the plurality of second chip on films closest to the start data line is electrically coupled to the second end of the start data line.

4. The array substrate according to claim 3, wherein the plurality of first chip on films is arranged sequentially in a second direction, the plurality of second chip on films is arranged sequentially in the second direction, and the second direction intersects the first direction.

5. The array substrate according to claim 3, wherein the plurality of first chip on films is arranged between the first circuit board and the data line, in the first chip on film in the plurality of first chip on films closest to the end data line, a first active data channel electrically coupled to the first end of the end data line is a first multiplexing data channel, and the other end of the first connection line is electrically coupled to the first end of the end data line through the first multiplexing data channel; and the plurality of second chip on films is arranged between the second circuit board and the data line, a second active data channel electrically coupled to the second end of the start data line is a second multiplexing data channel, one end of the second connection line is electrically coupled to the second end of the start data line through the second multiplexing data channel, in the second chip on film in the plurality of second chip on films closest to the end data line, a second active data channel electrically coupled to the end data line is a third multiplexing data channel, and the other end of the second connection line is electrically coupled to the second end of the end data line through the third multiplexing data channel.

6. The array substrate according to claim 5, further comprising a timing controller circuit arranged at a side of the array substrate away from the subpixels, wherein the timing controller circuit is configured to apply a corresponding differential signal to the plurality of first chip on films through the first circuit board and apply a corresponding differential signal to the plurality of second chip on films through the second circuit board; and each first chip on film is configured to generate a corresponding data signal in accordance with the received differential signal, and write the data signal into the first end of the corresponding data line, each second chip on film is configured to generate a corresponding data signal in accordance with the received differential signal, and write the data signal into the second end of the corresponding data line, for a same data line, the data signal written into the first end is the same as the data signal written into the second end.

7. The array substrate according to claim 6, wherein for a same data line, a signal delay time for the data signal written into the first end is the same as a signal delay time for the data signal written into the second end.

8. The array substrate according to claim 6, wherein each first chip on film comprises a first driving Integrated Circuit (IC) electrically coupled to the first active data channels in the first chip on film, and the first driving IC is configured to generate data signals corresponding to the first active data channels respectively in accordance with the received differential signal, and transmit the data signal to the first end of the corresponding data line through the corresponding first active data channel; and each second chip on film comprises a second driving IC electrically coupled to the second active data channels in the second chip on film, and the second driving IC is configured to generate data signals corresponding to the second active data channels respectively in accordance with the received differential signal, and transmit the data signal to the second end of the corresponding data line through the corresponding second active data channel.

9. The array substrate according to claim 8, wherein the first connection line is electrically coupled to the second connection line.

10. The array substrate according to claim 8, wherein the data signal applied by the second driving IC to the second active data channel electrically coupled to the second end of the end data line is the same as the data signal applied by the second driving IC to the second active data channel electrically coupled to the second end of the start data line.

11. The array substrate according to claim 8, wherein the first circuit board is provided with a plurality of first data transmission lines electrically coupled to the driving ICs in the plurality of first chip on films respectively, the second circuit board is provided with a plurality of second data transmission lines electrically coupled to the driving ICs in the plurality of second chip on films respectively, and the timing control circuit is electrically coupled to the plurality of first data transmission lines and the plurality of second data transmission lines.

12. The array substrate according to claim 3, wherein the first chip on film and the second chip on film corresponding to a same data line group are arranged opposite to each other in the first direction.

13. The array substrate according to claim 1, wherein in the plurality of data lines, the data signals applied to a same data line have same polarity, the data signals applied to adjacent data lines have opposite polarities, and the data signal applied to the start data line has same polarity as the data signal applied to the end data line.

14. A display device, comprising the array substrate according to claim 1.

* * * * *